(12) United States Patent
Chen et al.

(10) Patent No.: US 8,010,912 B2
(45) Date of Patent: Aug. 30, 2011

(54) METHOD OF SHRINKING SEMICONDUCTOR MASK FEATURES FOR PROCESS IMPROVEMENT

(75) Inventors: Vincent Chen, Newport Beach, CA (US); Vahid Manian, Coto de Caza, CA (US)

(73) Assignee: Broadcom Corporation, Irvine, CA (US)

( * ) Notice: Subject to any disclaimer, the term of this patent is extended or adjusted under 35 U.S.C. 154(b) by 448 days.

(21) Appl. No.: 12/073,685

(22) Filed: Mar. 7, 2008

(65) Prior Publication Data
US 2008/0222596 A1  Sep. 11, 2008

Related U.S. Application Data

(60) Provisional application No. 60/905,816, filed on Mar. 9, 2007.

(51) Int. Cl.
*G06F 17/50* (2006.01)
(52) U.S. Cl. ............... 716/50; 716/51; 716/52; 716/53; 716/54; 716/55; 716/56
(58) Field of Classification Search ............... 716/1, 2, 716/19, 20, 21
See application file for complete search history.

(56) References Cited

U.S. PATENT DOCUMENTS

| | | | |
|---|---|---|---|
| 6,584,610 B1 * | 6/2003 | Wu et al. | 716/19 |
| 6,622,288 B1 * | 9/2003 | Wang et al. | 716/2 |
| 7,493,588 B2 * | 2/2009 | Yang | 716/19 |
| 7,827,518 B2 * | 11/2010 | Wu et al. | 716/53 |
| 2002/0002697 A1 * | 1/2002 | Kotani et al. | 716/2 |
| 2003/0088849 A1 * | 5/2003 | Yamauchi | 716/19 |
| 2005/0005256 A1 * | 1/2005 | Rittman | 716/19 |
| 2005/0076316 A1 * | 4/2005 | Pierrat et al. | 716/4 |
| 2008/0184183 A1 * | 7/2008 | Kobayashi | 716/9 |
| 2009/0019419 A1 * | 1/2009 | Misaka et al. | 716/21 |

FOREIGN PATENT DOCUMENTS

JP    2008186076 A  *  8/2008

* cited by examiner

*Primary Examiner* — Helen Rossoshek
(74) *Attorney, Agent, or Firm* — Sterne, Kessler, Goldstein & Fox P.L.L.C.

(57) ABSTRACT

Provided is a method to design an integrated circuit. The method reduces a time delay between introduction of a new lithography process and a start of production. A first semiconductor mask is designed at a first process feature size. The first process feature size can be based on an anticipated process feature size of the new lithography process. A second semiconductor mask is created by enlarging the first semiconductor mask to a second process feature size for which production is available. Thus, the second process feature size is larger than the first process feature size. An integrated circuit (IC) is fabricated with the second semiconductor mask. After the new semiconductor process has been developed and is available for production, another IC is fabricated with the first semiconductor mask.

7 Claims, 2 Drawing Sheets

METHOD OF SHRINKING SEMICONDUCTOR MASK FEATURES FOR PROCESS IMPROVEMENT

CROSS REFERENCE TO RELATED APPLICATIONS

This application claims benefit of U.S. Provisional Application No. 60/905,816, filed Mar. 9, 2007, which is incorporated herein by reference in its entirety.

FIELD OF THE INVENTION

The present invention generally relates to semiconductor design and fabrication, and more specifically to semiconductor masks.

BACKGROUND OF THE INVENTION

There is never-wavering demand for integrated circuits (ICs) having a process feature size smaller than that of present-day ICs. When improved lithography equipment is introduced to accommodate this demand, there is an detrimental impact on product launch and fabrication schedules due to a delay between availability of production at the smaller process feature size and a start of production. This unfortunate delay is due in part to a need for time to design new semiconductor masks having features at the smaller process feature size. The time delay impacts a company's profitability by creating an opportunity loss.

At first glance, linearly reducing a semiconductor mask having features at a larger process feature size to the smaller process feature size appears appealing. In fact, some mask features may be linearly reduced from the larger process feature size to the smaller process feature size, that is, without any redesign. However, not all mask features may be linearly reduced. Some critical circuits malfunction when fabricated from masks having features that are reduced linearly. For example, in a circuit having both analog and digital circuits that are fabricated from a linearly-reduced mask, timing circuits fail to properly function because some IC elements become too small at the smaller process feature size. Therefore, simply reducing all mask features linearly is not always a viable method of producing a mask having features at the smaller process feature size.

As a result, mask features of critical IC elements must be redesigned when the circuit is to be fabricated at the smaller process feature size. However, redesign of even a common IC element, such as a pad, takes time that detrimentally impacts fabrication and product launch schedules. Compounding the redesigner's challenge are factors such as reducing circuit area (i.e. substrate real estate) as well as standardizing a circuit mask so multiple foundries may fabricate the same IC.

Thus, what is needed is an method for reducing a time delay between the foundry's initial production capability and actual start of production at the smaller process feature size as well as overcoming other shortcomings described above.

BRIEF SUMMARY OF THE INVENTION

In one embodiment, there is a method to produce an integrated circuit. The method reduces a time delay between introduction of a new lithography process and a start of production. A first semiconductor mask is designed at a first process feature size. The first process feature size is based on an anticipated smaller process feature size of the new lithography process that is to be available in the future. A second semiconductor mask is created by enlarging the first semiconductor mask to a second process feature size for which production is currently available. Thus, the second process feature size is larger than the first process feature size. An integrated circuit (IC) is fabricated with the second semiconductor mask. After the smaller semiconductor process has been developed and is available to produce ICs, another IC is fabricated with the first semiconductor mask having features at the first smaller feature size.

Additional features and advantages of the invention are set forth in the description that follows, and in part are apparent from the description, or may be learned by practice of the invention. The advantages of the invention are realized and attained by the structure and particularly pointed out in the written description and claims hereof as well as the appended drawings.

Both the foregoing general description and the following detailed description are exemplary and explanatory and are intended to provide further explanation of the invention as claimed.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

The invention is described with reference to the accompanying drawings. The drawing in which an element first appears is typically indicated by the leftmost digit(s) in the corresponding reference number.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims.

The embodiment(s) described and references in the specification to "one embodiment," "an embodiment," "an example embodiment," etc., indicate that the embodiment(s) described may include a particular feature, structure, or characteristic. However, every embodiment may not necessarily include the particular feature, structure, or characteristic. Moreover, such phrases are not necessarily referring to the same embodiment. When a particular feature, structure, or characteristic is described in connection with an embodiment, it is understood that it is within the knowledge of one skilled in the art to effect such feature, structure, or characteristic in connection with other embodiments, whether or not explicitly described.

As used herein, the term "process feature size" is a smallest size of a semiconductor feature that can be created by a particular lithographic process where the semiconductor feature functions properly. For example, and without limitation, some process feature sizes are 40 nm, 45 nm, 0.11 nm, and 0.13 nm.

Described herein is a method to produce an integrated circuit. Also described is a method to design an integrated circuit mask. When either method is executed, it reduces a delay between introduction of a new lithography process having a smaller process feature size than current lithography processes and a start of production by anticipating changes to mask features.

Figure 1:
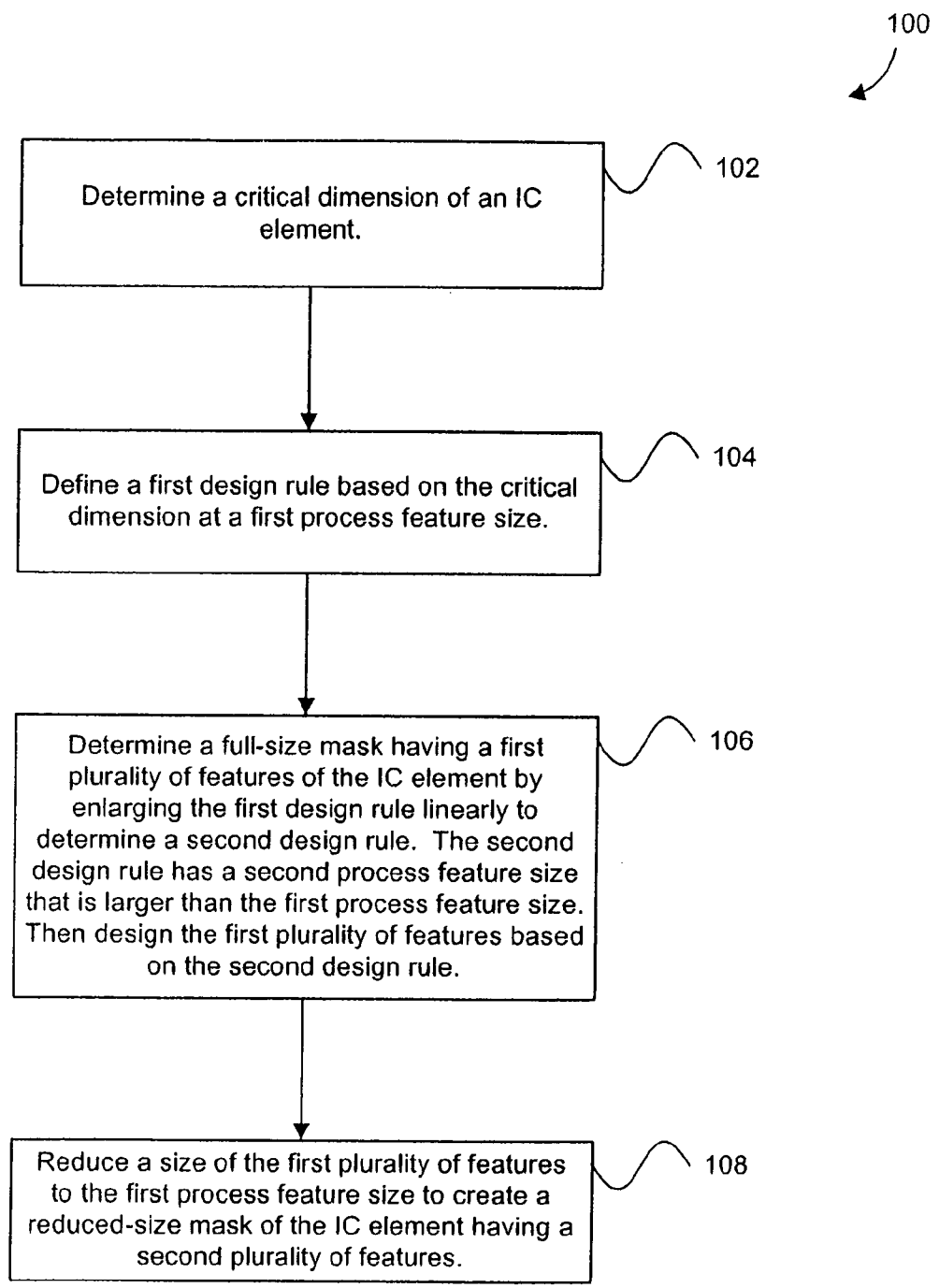
FIG. 1 is a flowchart of an exemplary method to design a semiconductor mask.

FIG. 1 is a flowchart of an exemplary method 100 to design a semiconductor mask. The method 100 can be executed prior to introduction of the lithography process at the smaller process feature size.

In step 102, a critical dimension of an integrated circuit (IC) element is determined. Examples of the IC element include a transistor, a resistor, a pad, a capacitor, and other semiconductor devices such as a critical circuit. An example of a critical circuit is one that malfunctions when fabricated from masks having linearly-reduced features. The critical dimension can be determined in part by characterizing a test structure including the IC element to determine an operating limit of the IC element. For example, the IC element can be tested to determine how small the IC element can be linearly reduced prior to malfunction.

In step 104, a first design rule based on the critical dimension at a first process feature size is determined. The first process feature size is an anticipated process feature size of the new lithography process implemented by a foundry. For example, if a current process feature size is 45 nm, then the anticipated process feature size is a smaller process feature size such as, for example, 40 nm.

The first design rule can also be based on die area and layout sensitivity of the IC element which are based on the critical dimension. The IC element can be tested to determine a limit of the die area and the layout sensitivity. The first design rule can be based on the die area to minimize area occupied by the IC element.

In step 106, a full-size mask for an integrated circuit having a first plurality of features including the IC element is designed. Initially, the first design rule is linearly enlarged to determine a second design rule. The second design rule has a second process feature size that is larger than the first process feature size. The first plurality of features is then designed based on the second design rule. A full-sized mask having the first plurality of features can be fabricated and used to produce integrated circuits that include the IC element.

Further, the second process feature size may substantially equal a minimum common process feature size that is available at the time of the layout. If the IC element is to be fabricated at multiple foundries, the minimum common process feature size between at least two foundries must be determined so the IC element may be fabricated at all tested foundries. A process capability test can determine a minimum process feature size for a foundry. The process capability test is run on the multiple foundries to determine a process feature size limit for each foundry, and thus a minimum common process feature size can be determined. Therefore, when multiple foundries are to be used, the second design rule is defined and standardized based on the minimum common process feature size. A sample chip including the full-size IC element is created and tested to verify function. Further, timing characteristics of the full-size circuit are tested to detect design defects.

In step 108, a size of the first plurality of features is reduced to the first process feature size to create a reduced-size mask for an integrated circuit including the IC element having a second plurality of features. The reduction is linear and occurs without redesign of the mask features.

The features of the full-size and the reduced-size masks that are used to produce the IC element can be stored in a library, such as a library of mask features, so that mask features can be reused in design of other circuits. For example, the reduced-size mask can be added to a library containing mask features designed for use at 40 nm and the full-size mask may be added to a library containing mask features designed for use at 45 nm. The 40 nm library and the 45 nm library can be combined so that a circuit designer can design circuits for fabrication at 40 nm. Thus, an IC may be designed and fabricated using a combination of mask features that are based on different design rules and different process feature sizes. Use of such a library is beneficial when reducing some features on a mask to produce a functioning critical circuit at the smaller process feature size without redesigning the electrical circuit.

When mass production at the first process feature size becomes possible or manufacturing capacity becomes available, the mask features for the IC element are already designed at the first process feature size. This reduces a time delay between a foundry's initial production capability and start of production. In the meantime, the IC element (and corresponding circuit) can be fabricated using the full-size parameter using the second process, so that ICs can be delivered during the development/proof of the reduced sized (i.e. second) process. Thus, design of the IC element does not delay production of the IC element in the first process feature size. Therefore, IC production schedules are not detrimentally impacted by IC element or circuit design delays, or process development delays. An IC including the reduced-size IC element may be produced according to the method 100. The IC may be tested to verify function.

Figure 2:
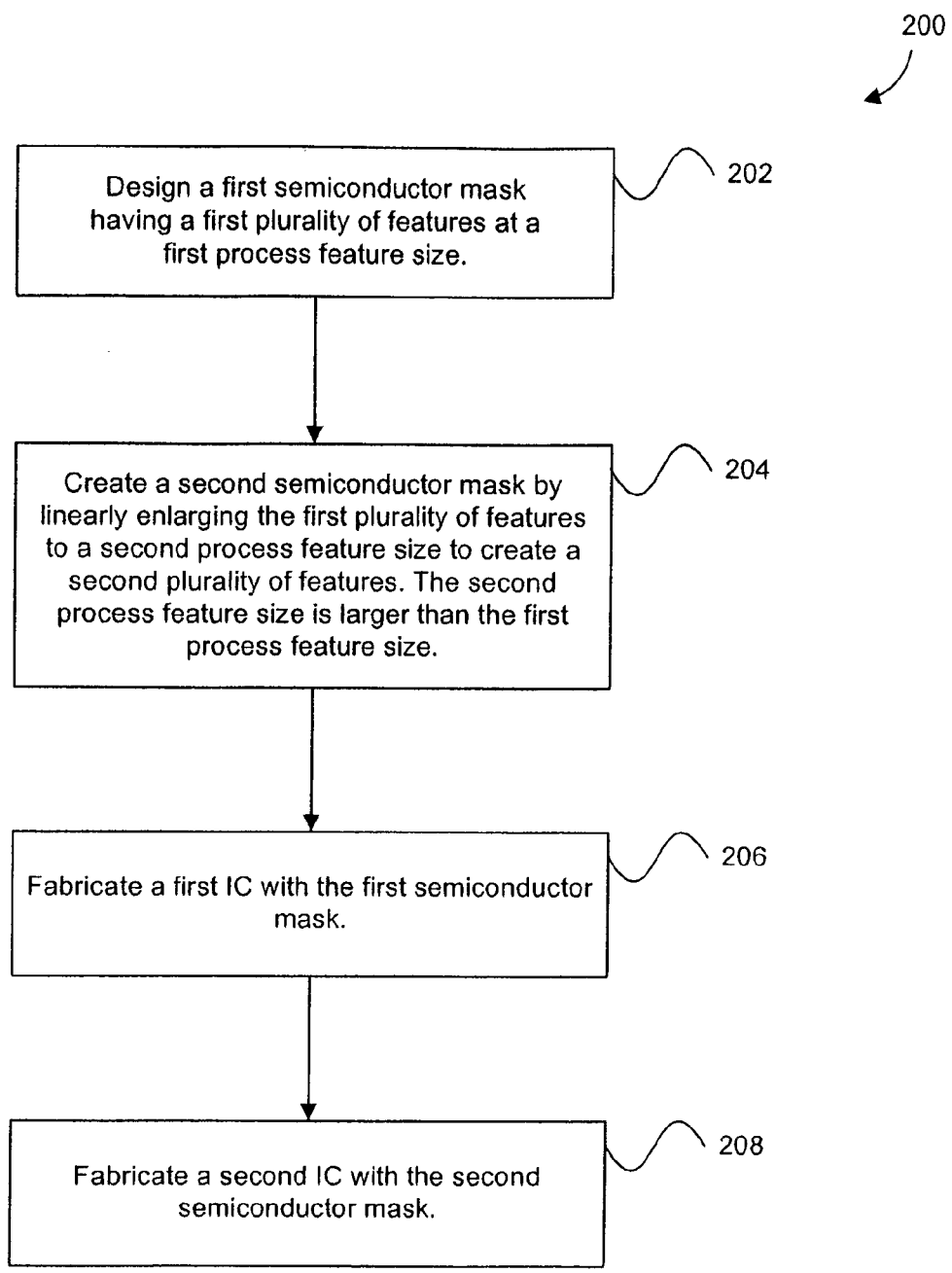
FIG. 2 is a flowchart of an exemplary method to produce an integrated circuit.

FIG. 2 is a flowchart that illustrates an exemplary method 200 to produce an integrated circuit. In step 202, a first semiconductor mask having a first plurality of features is designed at a first, or reduced, process feature size. The first process feature size may be substantially 40 nm, 0.11 nm, or a similar size. The first process feature size may be one for which mass production is not yet possible or for which manufacturing capacity is not available.

In step 204, a second semiconductor mask is created by enlarging the first plurality of features to a second process feature size to create a second plurality of features. The second process feature size is larger than the first process feature size and can be substantially 45 nm, 0.13 nm, or a similar size. The second process feature size is one for which manufacturing is possible or available. The semiconductor mask can be enlarged linearly. In other words, features are enlarged proportionally. For example, all features are increased in size by a factor of 1.125× from their first process feature size.

In step 206, a first IC is fabricated with the first semiconductor mask. This step may occur before or after step 208. The step 206 occurs when the first process feature size is one for which production is possible or for which manufacturing capacity is available.

In step 208, a second IC is fabricated with the second semiconductor mask. Thus, an IC may be produced according to the method 200. When mass production at the first process feature size becomes possible or manufacturing capacity becomes available, the first semiconductor mask is already designed for use at the first process feature size. This reduces a time delay between a foundry's initial production capability and actual start of production at the smaller process feature size because there is no delay due to a need to design a mask at the smaller feature size. In the meantime, the second semiconductor mask is used so that ICs can be delivered using a current process feature size.

Conclusion

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A method to design an integrated circuit (IC) mask, comprising:
   determining a critical dimension of an IC element, wherein the critical dimension is the smallest dimension of a functioning IC element;
   defining a first design rule based on the critical dimension at a first process feature size, wherein the first design rule governs the possible placement of IC elements to form an integrated circuit, based on die area and/or layout sensitivity;
   designing, using at least one processor, a full-size mask for an integrated circuit having a first plurality of features including the IC element, comprising:
      enlarging said first design rule linearly to determine a second design rule,
      wherein said second design rule has a second process feature size that is larger than said first process feature size;
      designing said first plurality of features based on said second design rule; and
   linearly reducing, using at least one processor, a size of said first plurality of features to said first process feature size to create a reduced-size mask for an integrated circuit including the IC element having a second plurality of features.

2. The method of claim 1, wherein said defining a first design rule includes:
   determining a die area based on said critical dimension, wherein said first design rule is based on said die area.

3. The method of claim 2, wherein said defining a first design rule includes:
   determining a die area limit; and
   basing said first design rule on said die area limit.

4. The method of claim 1, wherein said defining a first design rule includes:
   determining a process feature size for a particular foundry, wherein the process feature size is the smallest size of a semiconductor feature that can be created by a particular lithographic process; and,
   basing said first design rule on said process feature size.

5. The method of claim 1, further including:
   creating a sample chip with IC elements corresponding to the larger dimensions of the first IC mask; and,
   testing the timing characteristics of the IC element.

6. The method of claim 1, further including:
   fabricating the full-size mask.

7. The method of claim 1, further including:
   fabricating the reduced-size mask.

* * * * *